(12) United States Patent
Haba et al.

(10) Patent No.: US 6,309,910 B1
(45) Date of Patent: Oct. 30, 2001

(54) MICROELECTRONIC COMPONENTS WITH FRANGIBLE LEAD SECTIONS

(75) Inventors: Belgacem Haba, Cupertino, CA (US); Kurt Raab, Phoenix, AZ (US)

(73) Assignee: Tessera Inc., San Jose, CA (US)

( * ) Notice: Subject to any disclaimer, the term of this patent is extended or adjusted under 35 U.S.C. 154(b) by 0 days.

(21) Appl. No.: 09/313,402

(22) Filed: May 18, 1999

Related U.S. Application Data

(60) Provisional application No. 60/085,891, filed on May 18, 1998.

(51) Int. Cl.[7] .......................... H01L 21/44; H01L 21/48; H01L 21/50; H01L 21/301
(52) U.S. Cl. ......................... 438/113; 438/461; 438/611
(58) Field of Search ................... 438/461, 611, 438/113; 29/827; 216/14

(56) References Cited

U.S. PATENT DOCUMENTS

| | | | |
|---|---|---|---|
| 5,148,265 | 9/1992 | Khandros et al. | 357/80 |
| 5,230,144 | 7/1993 | Ootsuki | 29/827 |
| 5,337,216 | * 8/1994 | McIver | |
| 5,398,863 | 3/1995 | Grube et al. | 228/106 |
| 5,489,749 | 2/1996 | Distefano et al. | 174/261 |
| 5,491,302 | 2/1996 | Distefano et al. | 114/260 |
| 5,629,239 | 5/1997 | Distefano et al. | 216/14 |
| 5,679,194 | * 10/1997 | Fjelstad et al. | |
| 5,807,453 | * 9/1998 | Smith et al. | |
| 5,915,752 | * 6/1999 | DiStefano et al. | |
| 5,977,618 | * 11/1999 | DiStafano et al. | |

* cited by examiner

Primary Examiner—John F. Niebling
Assistant Examiner—Josetta I. Jones
(74) Attorney, Agent, or Firm—Lerner, David, Littenberg, Krumholz & Mentlik, LLP

(57) ABSTRACT

Flexible leads for making electrical connection in microelectronic components include a frangible intermediate section. The frangible intermediate section is formed by a region within the lead having weakened mechanical integrity. The lead is formed by depositing a layer of lead forming material over an irregularity provided on a supporting substrate so as to provide a region of altered crystal morphology. The region of altered crystal morphology provides the lead with the weakened region.

31 Claims, 5 Drawing Sheets

MICROELECTRONIC COMPONENTS WITH FRANGIBLE LEAD SECTIONS

The present invention claims the benefit of the U.S. Provisional Application No. 60/085,891 filed on May 18, 1998, the disclosure of which is incorporated by reference herein.

FIELD OF THE INVENTION

The present invention relates in general to microelectronic components such as semiconductor chip assemblies, and more particularly, to frangible leads for use in such microelectronic components, as well as methods of manufacturing same.

BACKGROUND OF THE INVENTION

Semiconductor chips typically are connected to external circuitry through contacts on the surface of the chip. The contacts may be disposed in a grid on the front surface of the chip or in elongated rows extending along the edges of the chip's front surface. Each such contact must be connected to an external circuit element such as a circuit trace on a supporting substrate or circuit panel. In the conventional wire bonding process, the back surface of the chip is physically mounted on the substrate. A bonding tool bearing a fine wire is engaged with an individual contact on the face surface of the chip so as to bond the wire to the contact. The tool is then moved to a contact pad of the circuit on the substrate, while dispensing wire through the tool, until the tool engages the contact pad on the substrate and the wire is bonded thereto. This process is repeated for each contact.

In a tape automated bonding or process, a dielectric supporting tape is provided with a hole slightly larger than the chip. Metallic leads are provided on the dielectric tape are cantilevered into the hole in the tape. An inner end of each lead projects inwardly beyond the edge of the hole. These plural leads are arranged side-by-side in rows. Each row of contacts on the chip is aligned with one such row of leads. The inner ends of the leads are bonded to the contacts of the chip by ultrasonic or thermocompression bonding. The outer ends of the leads are connected to the external circuitry. U.S. patent application Ser. No. 08/560,272 entitled "A Structure and Method For Making a Compliant Lead For a Microelectronic Device" filed on Nov. 11, 1995, which application is assigned to the same assignee of the present application, is hereby incorporated by reference herein. The '272 Application discloses leads having a recrystallized surface layer thereby creating a fine grain, dense surface layer of lead material.

The rapid evolution of the semiconductor art has created continued demand for incorporation of progressively greater numbers of contacts and leads in a given amount of space. U.S. Pat. No. 5,489,749, the disclosure of which is incorporated by reference herein, offers one solution. As disclosed in certain embodiments of the patent, a semiconductor chip connection component may include a plurality of electrically conductive leads and may also include a support structure such as a flexible, dielectric film with a compliant, typically elastomeric underlayer disposed beneath the flexible film. Each such lead desirably is connected to a terminal disposed on the surface of the support structure. A connection section of each lead extends across a gap in the support structure. A first end of each connection section, connected to one of the terminals, is permanently attached to the support structure, whereas the opposite second end of the connection section is releasably attached to the support structure. For example, the second end of each connection section may be connected through a frangible section connecting the second end to a bus structure anchored on the support structure.

In certain processes described in the '749 Patent, the connection component is juxtaposed with the chip so that the support structure, and preferably a compliant layer thereof, overlies the contact-bearing surface of the chip and so that the gap or slot in the support structure is aligned with a row of contacts on the chip. This process serves to align each connection section with a contact on the chip. After placement of the connection component on the chip, each lead is engaged by a bonding tool. The bonding tool moves downwardly towards the surface of the chip. As the bonding tool moves downwardly, it disengages the second end of each lead connection section from the support structure, as by breaking the frangible section of the lead, and moves the connection section downwardly into engagement with the chip contact. At the same time, guide surfaces on the bottom of the bonding tool engage the connection section and guide it into more precise alignment with the associated contact. The bonding tool then bonds the connection section to the contact.

The end-supported lead bonding processes according to the '749 Patent offer numerous advantages. Because each lead is supported at both ends prior to bonding, it can be maintained in position until it is captured by the bonding tool. The bonding tool will reliably capture the correct lead, and hence there is little chance that an incorrect lead will be bonded to a contact. Moreover, the products resulting from the disclosed processes allow free movement of the terminals on the support structure relative to the chip after connection, both in the X and Y directions, parallel to the chip surface, and in the Z or compliance direction perpendicular to the chip surface. Thus, the assembly can be readily tested by engaging a multiple probe test fixture with the terminals. When the terminals on the support structure are bonded to contact pads of a substrate, as by solder bonding or other processes, the assembly can compensate for differential thermal expansion between the chip and the substrate, as by flexing of the leads and deformation of the flexible support structure.

Certain components and processes disclosed in the '749 Patent can be used to fabricate semiconductor chip assemblies with closely spaced leads. Merely by way of example, rows of connection sections may be provided side-by-side at center-to-center spacing of about 100 micrometers or less, and may be successfully bonded to the contacts of the chip. Additional improvements in the bonding structures and techniques as set forth in the commonly assigned U.S. Pat. Nos. 5,398,863 and 5,491,302, the disclosures of which are hereby incorporated by reference herein, still further facilitate bonding of closely spaced leads and formation of reliable assemblies even where the leads are extremely small, using the basic techniques set forth in the '749 Patent.

However, manufacture of the preferred connection components for use in these processes has heretofore required precise control of photoforming processes. The leads utilized in certain end-supported lead bonding processes have incorporated connection sections of substantially uniform widths and frangible sections having widths less than the width of the connection section. For example, the frangible section may be defined by a pair of V-shaped notches extending inwardly towards one another in the widthwise direction from laterally opposite edges of the connection section. The width between the points of the V is substantially less than the width of the remaining portion of the connection section. Although this arrangement provides useful frangible sections, it imposes stringent requirements on the photoforming process. The process must be capable of forming feature sizes as small as the smallest width within the frangible section. Stated another way, the photoforming process must be more precise than required to form the connection sections themselves.

Bonding structures and techniques which overcome the limitations imposed by the photoforming process are disclosed in commonly assigned U.S. Pat. No. 5,629,239, the disclosure of which is hereby incorporated by reference. According to the '239 Patent, a plurality of leads, each extending over a gap in a support structure, include lead-forming material in an elongated strip-like lead region extending in a lead direction. Frangible sections in the leads are formed by applying a weakening treatment to the lead-forming material throughout an elongated treatment zone extending across a plurality of the lead regions transverse to the lead direction. The weakening treatment is applied without regard to the edge boundaries of the leads.

The weakening treatment may be applied after formation of the individual leads. Where the leads are formed in an additive plating process, the lead material may be deposited in the strip-like lead regions, and subsequently exposed to the weakening treatment. The weakening treatment may include exposure to radiant energy such as a laser beam to ablate the lead-forming material, chemical etchants or alloying agents, or mechanical deformation by a tool. These treatments can be applied after formation of the leads throughout the treatment zone. For example, radiant energy or chemical agents can be applied using a mask having an elongated slot defining the treatment zone extending across plural lead regions. There is no need to control the extent of the weakening treatment precisely in the width-wise direction of the leads, transverse to the leads themselves. The process used to form the leads need not provide features any finer than the width of the individual lead connection sections themselves. Stated another way, the width of each lead connection section can be as fine as the finest feature size permitted by the photoforming process.

There has been a desire heretofore for continuously improving methods of making connection components useful in end-supported lead bonding and for improved connection components incorporating frangible leads.

SUMMARY OF THE INVENTION

The present invention discloses microelectronic components and flexible leads provided with a weakened frangible intermediate section formed, by way of example, by its crystal morphology, e.g., crystal grain growth, grain boundary formation, grain size and the like which all contribute to a lack of mechanical integrity. The frangible intermediate section is formed in each of the leads by depositing lead forming material over an irregularity provided on a supporting substrate. The irregularity may take the form of an opening or projection or other feature which will affect the crystal morphology to provide a region of weakened mechanical integrity in the lead.

In accordance with one embodiment of the present invention there is described a method of making a lead having a frangible intermediate section for use in a microelectronic component, the method comprising the steps of depositing a metal layer over a support; providing an irregularity on the metal layer; depositing lead forming material over the metal layer and the irregularity; and removing the irregularity whereby the lead includes a frangible intermediate section at the location of the irregularity.

In accordance with another embodiment of the present invention there is described a method of making a microelectronic component comprising the steps of forming at least one lead from lead forming material extending over a gap extending through a vertical extent of a support structure, each lead having a first connection section extending from the support structure on one side of the gap, a second connection section extending from the support structure on the other side of the gap, and a frangible intermediate section joining the connection sections, the frangible intermediate section formed by depositing the lead forming material over an irregularity at the location of the frangible intermediate section, the frangible intermediate section and at least a part of the first connection section aligned over the gap so that the first connection section of each lead can be detached from the second connection section by breaking the frangible intermediate section upon being displaced in the gap.

In accordance with another embodiment of the present invention there is described a method of making electrical connection to a microelectronic component having at least one contact, the method comprising juxtaposing a connection component with a microelectronic component, the connection component having a supporting structure and at least one lead made in accordance with the aforesaid method connected to the supporting structure, the lead including a bond region adjacent the frangible intermediate section adapted to be aligned with the contact, severing the lead at the frangible intermediate section, and bonding the bond region of the lead to the contact on the microelectronic component.

In accordance with another embodiment of the present invention there is described a method of making a microelectronic assembly comprising electrically connecting a microelectronic component to another microelectronic component, at least one of the microelectronic components made in accordance with the aforesaid method.

In accordance with another embodiment of the present invention there is described a lead adapted for connection to a microelectronic component, the lead made in accordance with the aforesaid method.

In accordance with another embodiment of the present invention there is described a microelectronic component made in accordance with the aforesaid method.

In accordance with another embodiment of the present invention there is described a microelectronic assembly made in accordance with the aforesaid method.

In accordance with another embodiment of the present invention there is described a lead adapted for connection to a microelectronic component, the lead comprising a layer of lead forming material including a region having a crystal morphology different than the crystal morphology of the material adjacent the region, whereby the region provides a frangible intermediate section for severing the lead thereat.

In accordance with another embodiment of the present invention there is described a microelectronic component having a supporting structure and at least one lead connected to the supporting structure, the lead constructed in accordance with the aforesaid description.

In accordance with another embodiment of the present invention there is described a microelectronic component comprising at least one lead from lead forming material constructed in accordance with the aforesaid description extending over a gap extending through a vertical extent of a support structure, each lead having a first connection section extending from the support structure on one side of the gap, a second connection section extending from the support structure on the other side of the gap, the frangible intermediate section joining the connection sections, the frangible intermediate section and at least a part of the first connection section aligned over the gap so that the first connection section of each lead can be detached from the second connection section by breaking the frangible intermediate section upon being displaced in the gap.

In accordance with another embodiment of the present invention there is described a microelectronic assembly comprising a microelectronic component electrically connected to another microelectronic component, at least one microelectronic component constructed in accordance with the aforesaid description.

In accordance with another embodiment of the present invention there is described a microelectronic assembly comprising a microelectronic component electrically connected to another microelectronic component by at least one lead constructed in accordance with the aforesaid description.

BRIEF DESCRIPTION OF THE DRAWINGS

The above description, as well as further objects, features and advantages of the present invention will be more fully understood with reference to the following detailed description of microelectronic components with frangible lead sections, when taken in conjunction with the accompanying drawings, wherein.

DETAILED DESCRIPTION OF THE PREFERRED EMBODIMENTS

In describing the preferred embodiments of the subject matter illustrated and to be described with respect to the drawings, specific terminology will be resorted to for the sake of clarity. However, the invention is not intended to be limited to the specific terms so selected, and is to be understood that each specific term includes all technical equivalence which operate in a similar manner to accomplish a similar purpose.

Figure 1:
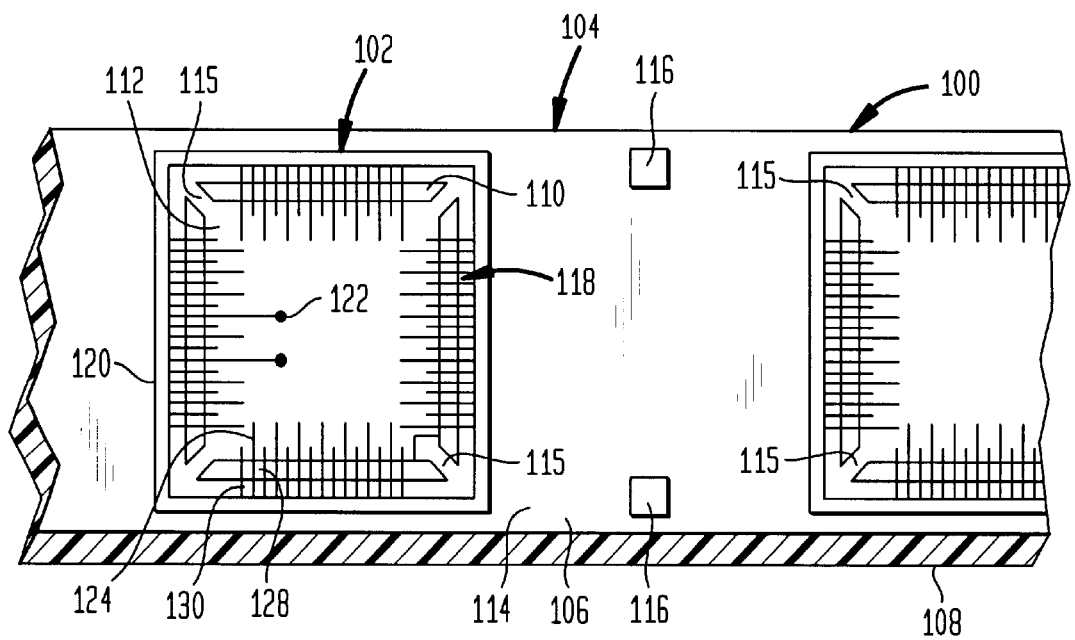
FIG. 1 is a diagrammatic plan view of a microelectronic component incorporating a lead having a frangible intermediate section constructed in accordance with one embodiment of the present invention.

Referring now to the drawings, wherein like reference numerals represent like elements, there is shown in FIG. 1 a microelectronic component in accordance with one embodiment of the invention manufactured from a continuous tape 100. As used herein, microelectronic component broadly refers to semiconductor chips, wafers, connection components, interposers and any other electrical assembly incorporating conductive elements such as leads and/or contacts and which are useful in mounting and connecting electronic devices such as semiconductor devices. The tape 100 includes a plurality of microelectronic connection components 102 each incorporating a support structure 104. The support structure 104 of each component 102 is in the nature of a flexible, sheet-like dielectric layer 106, for example, a sheet of polyimide material. The support structure 104 also includes a compliant layer 108 lying beneath the structure. The compliant layer 108 typically is formed of a low modulus material such as silicone, flexibilized epoxy or gel and the like.

The support structure 104 of each component 102 is provided with gaps 110 in the form of elongated slots extending through the support structure from its top surface to its bottom surface. The gaps 110 subdivide the support structure 104 of each component 102 into a central portion 112 and a peripheral portion 114. The central portion 112 may be temporarily joined to the peripheral portion 114 by a plurality of ribs 115. This enables adapting the tape 100 for use in various chip mounting techniques, whereupon the ribs may be ultimately removed. The gaps 110 merge with one another so that the central portion 112 of each component 102 is not connected to the peripheral portion 114 of the support structure 104 by any other portion of the support structure. Rather, as discussed below, the central portion 112 is temporarily connected to the peripheral portion 114 of the support structure 104 by elongated electrically conductive bonding leads 118 extending across the gaps 110. The tape 100 may be provided with features such as sprocket holes 116 to facilitate feeding and movement of the tape in the production processes.

Each component 102 in accordance with this embodiment has a plurality of elongated electrically conductive buses 120 extending on the peripheral portion 114 of the support structure 104 alongside gaps 110 so that one such bus extends alongside of, and substantially co-directionally with, each gap. The buses 120 of each component 102 form a generally rectilinear, hooplike structure encircling the gaps 110 and the central portion 112 of the support structure 104.

Each component 102 further has electrically conductive terminals 122 disposed on the central portion 112 of the support structure 104 and a plurality of bonding leads 118 extending outwardly from the terminals. Each lead 118 includes a first connection section 124 on the central portion 112 connected to the terminals 122 and extending outwardly across one of the gaps 110, a frangible intermediate section 128 joined to the end of the first connection section and to the end of a second connection section 130 which joins the frangible intermediate section to the bus 120 lying alongside of the gaps. The connection section 130 may also be referred to as an end securement section. In addition, that portion of the connection section 124 overlying the support structure 104 can also be referred to as an end securement section. The connection sections 124, 130 lie in spaced apart generally parallel planes integrally connected within the gaps 110 to the frangible intermediate section 128.

The frangible intermediate sections 128 generally lie just inside the outer margins of gaps 110. The connection sections 124, 130 of all of the leads 118 associated with any given gap 110 extend generally perpendicular to the gap and generally side-by-side parallel to one another. In the embodiment illustrated, the connection sections 124, 130 and frangible intermediate sections 128 of the leads 118 bridge the gaps 110 and physically connect the central portion 112 of the support structure 104 with the peripheral portion 114 of the support structure.

Figure 2:
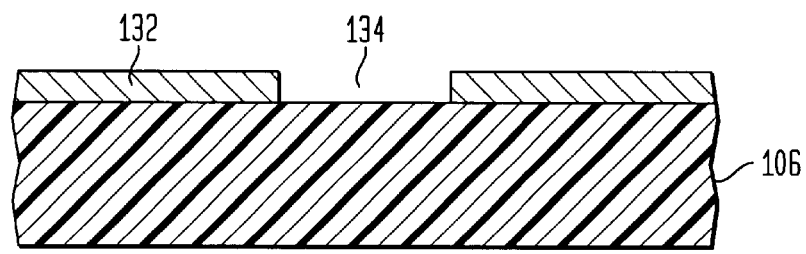
FIGS. 2 and 3 are cross-sectional views showing sequential steps in a method of making a lead having a frangible intermediate section in accordance with one embodiment of the present invention.

The connection components 102 as illustrated in FIG. 1 can be made by the various processes as schematically illustrated in FIGS. 2–10. At the beginning of the process as shown in FIG. 2, the dielectric layer 106 forming the support structure 104 is a continuous uninterrupted strip which does not have the gaps 110 therein. In accordance with one embodiment, a metal layer 132, such as copper or aluminum, is deposited such as by plating over the surface of the dielectric layer 106. The metal layer 132 may have a thickness on the order of about 0.1 to 10 microns. As shown, the metal layer 132 is provided with an irregularity in the nature of an opening 134 formed using conventional semiconductor processing techniques, for example, using a photolithographically patterned resist to permit etching of the metal layer 132 where the opening is to be formed. On the other hand, the opening 134 can be formed using an additive process of depositing the metal layer 132 on either side of a masked portion defining the opening. The opening 134 in a horizontal direction has a width of about 10 to 30 microns, but could be made smaller depending on lead width and lithographic capability.

Figure 3:
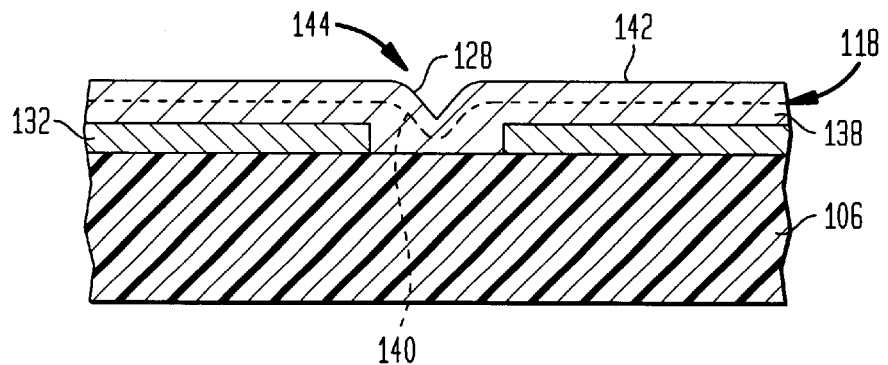

The leads 118 are formed from a conductive lead-forming material, such as gold, copper, gold-copper composite and the like which is deposited over the metal layer 132 and the opening 134 as shown in FIG. 3. By way of example, the leads 118 may be formed from an initial metal layer 138 such as copper which ultimately forms a continuous electrically conductive bridge across the opening 134. In this regard, it is contemplated that as the metal layer 138 is deposited onto the exposed surfaces of metal layer 132, the deposited metal will bridge the opening 134 forming a slight depression 140 which provides a weakened area within the metal layer 138 as to be described. The thickness of the metal layer 138 over the underlying metal layer 132 may be in the range of about 10 to 20 microns. A gold or gold-copper composite outer layer 142 may be plated over metal layer 138 to provide the lead 118 with a number of attributes, for example, sufficient mechanical strength to enable handling prior to the lead franging operation, providing a non-oxidizable surface for bonding and termination of potential crack propagation in the underlying metal layer. The outer layer 142 may have a thickness in the range of about 0.1 to 2.5 microns. Thus, as shown in FIG. 3, there is provided a region generally designated by reference numeral 144 aligned with opening 134 which forms the frangible intermediate section 128 of the lead 118.

By way of theory only, it is contemplated that the frangible intermediate section 128 is weakened not necessarily by virtue of its cross-sectional thickness, but by virtue of the manner in which the metal layer 138 is formed bridging the opening 134. That is, as noted hereinabove, the metal layer 138 as it is deposited onto the underlying metal layer 132, will begin to fill in the opening 134 until a substantially continuous layer is formed. However, it is contemplated that as the metal layer 138 on either side of the opening 134 joins each other within the opening 134, the resulting material within the opening 134, although providing electrical continuity, will have a crystal morphology which is weakened in comparison, for example, to the remaining portion of the metal layer 138. This may result, for example, in differences of crystal grain growth, grain boundary formation, grain size and the like which all contribute to a lack of mechanical integrity of weakened region 144.

Figure 4:
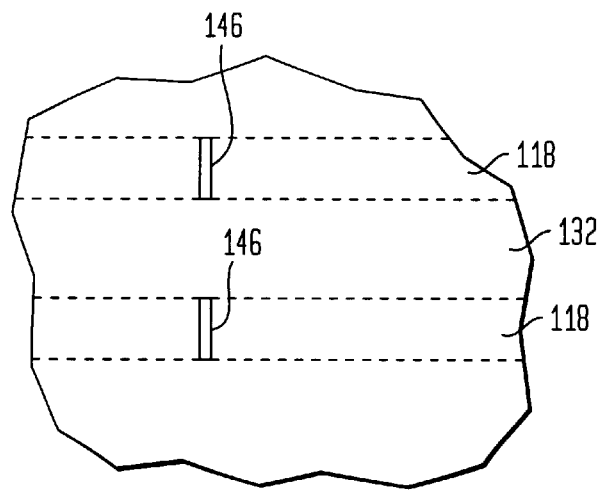
FIG. 4 is a partial top plan view showing one step in the construction of a lead having a frangible intermediate section in accordance with one embodiment of the present invention.
Figure 5:
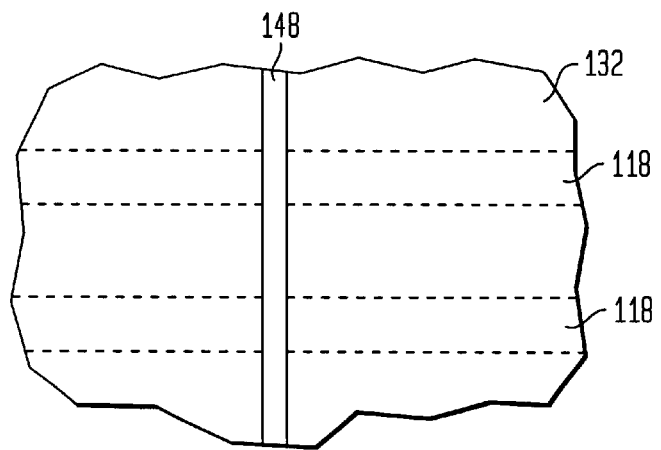
FIG. 5 is a partial top plan view showing one step in the construction of a lead having a frangible intermediate section in accordance with another embodiment of the present invention.

The opening 134, as shown in FIG. 4, may be formed in the nature of a plurality of individual segments 146. The segments 146 are arranged transverse to the longitudinal axis of the leads 118 at the location where the frangible intermediate portions 128 are to be formed. In another embodiment as shown in FIG. 5, the opening 134 is formed as a continuous opening 148 extending transversely to the longitudinal axis of a plurality of adjacent leads 118. In a similar manner, the opening 148 is arranged at the location where the frangible intermediate sections 128 are to be formed.

Figure 6:
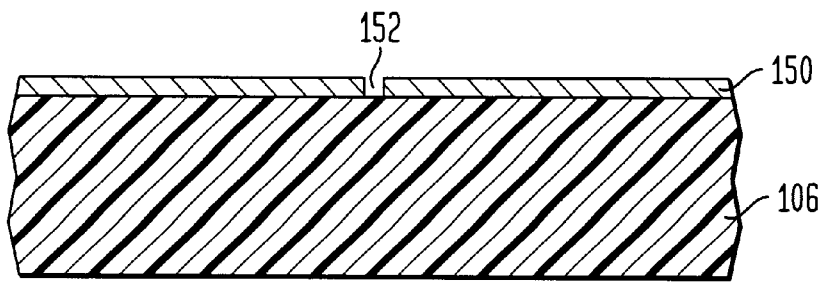
FIGS. 6 and 7 are cross-sectional views showing sequential steps in a method of making a lead having a frangible intermediate section in accordance with another embodiment of the present invention.

In accordance with a variation of the aforedescribed embodiment, a relatively thin metal layer 150, such as copper or aluminum, is deposited onto the surface of the dielectric layer 106 as shown in FIG. 6. The metal layer 150 may be deposited by initially seeding the surface of the dielectric layer 106 by, for example, sputtering or flash plating. The metal layer 150 has a thickness in the range of about 0.01 to 0.1 microns.

An irregularity in the nature of an opening 152 is formed in the metal layer 150 using any number of semiconductor processing techniques. For example, the opening 152 may be formed using the aforementioned photolithographic techniques, laser ablation and the like. It is contemplated that the width of the opening 152 should be relatively small, for example, on the order of about 10 to 30 microns or small as previously noted. As shown in FIGS. 4 and 5, the openings 152 can be formed as individual segments 146 or a continuous opening 148, both of which are aligned transversely to the leads 118 in the location where the frangible intermediate sections 128 are to be formed.

Figure 7:
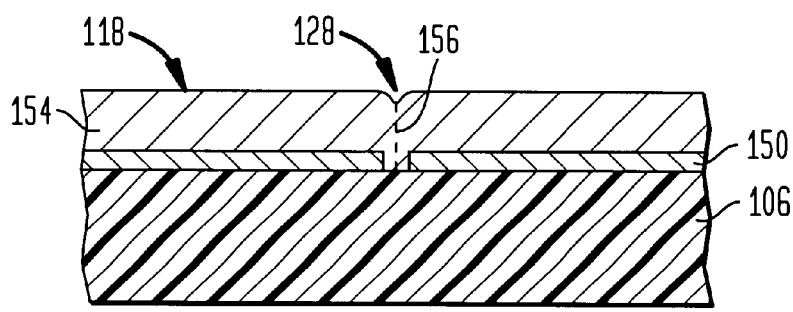

As shown in FIG. 7, during plating of the metal layer 154 forming the lead 118, a region which lacks mechanical integrity, e.g., mechanical discontinuity, is formed as indicated generally by the dashed lines 156. The region 156 which lacks mechanical integrity is formed as a result of the metal layer 154 being deposited over the narrow opening 152. In this regard, in the manner as previously explained, it is contemplated by way of theory only that the lead 118 is formed with significant transverse oriented grain boundaries in region 156 which result in a weakened portion of the metal layer 154. As such, region 156 is weaker than the remaining metal layer 154 in sheer and tensile strength to facilitate fracturing of the resulting lead 118. However, electrical continuity within the metal layer 154 forming the lead 118 is maintained. The metal layer 154 which forms the leads 118 may have a thickness in the range of about 10 to 20 microns. The metal layer 154, in the manner as previously described with respect to FIG. 3, may also be overplated with a layer of gold or gold-copper composite to, for example, enhance the mechanical integrity of the thus formed lead 118 or for the reasons previously noted.

Figure 8:
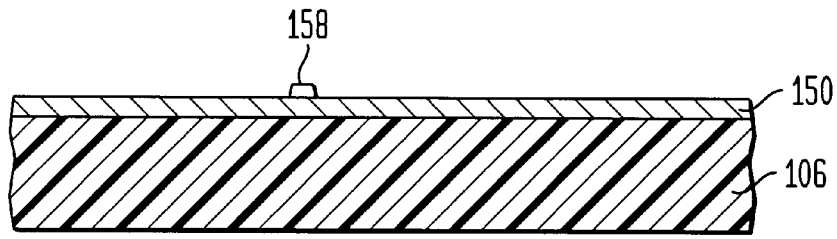
FIGS. 8 and 9 are cross-sectional views showing sequential steps in a method of making a lead having a frangible intermediate section in accordance with still another embodiment of the present invention.
Figure 9:
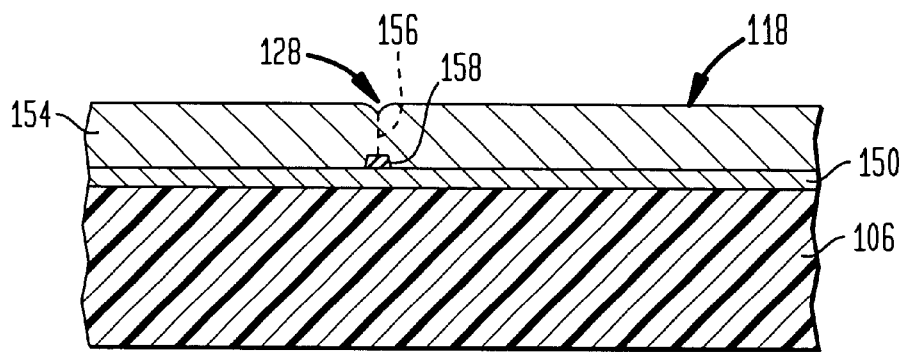

The weakened regions of the leads 118 forming the frangible intermediate sections 128 have thus far been described by plating or seeding a metal layer over an irregularity such as an opening, for example, openings 134, 152, within metal layers 132, 150. However, it is contemplated that the frangible intermediate section 128 also having a weakened region which lacks mechanical integrity may be formed without creation of the openings 134, 152. Turning to FIG. 8, a metal layer 150 is deposited onto the surface of a dielectric layer 106. An irregularity in the nature of a protruding projection 158 is deposited onto the surface of the metal layer. The projection 158 is formed of dielectric material, such as, photoresist material and the like which is non-conductive so as to function as a pseudo opening on the surface of metal layer 150. The projection 158 may have a height in the range of 5 to 10 microns or smaller, and a width in the range of 5 to 15 microns, dependent on the lead dimensions and lithography capability. The projection 158 may be in the form of a plurality of projection segments corresponding to segments 146 or a continuous longitudinally extending projection corresponding to opening 148. In either event, the projections 148 are aligned transverse to the longitudinal axis of the leads 118, while being positioned at the location where the frangible lead sections 128 are to be formed. Although the projection 158 has been disclosed as being rectangular in nature, it may be any shape desired, for example, triangular, square, rounded, oval and the like.

A metal layer 154, for example, gold, copper or gold-copper composites, forming the leads 118 is deposited over the metal layer 150 and projection 158. The thickness of metal layer 154 may be in the range of about 5 to 20 microns, i.e., thicker than the thickness of projection 158. In a similar manner as noted with respect to FIG. 7, the metal layer 154 is provided with a region 156 which lacks mechanical integrity at a location overlying projection 158. The region of mechanical discontinuity or lack of mechanical integrity is, by way of theory only, the result of significant transverse oriented grain boundary differentiation with respect to the remaining portion of the metal layer 154. This results in the formation of a weakened portion forming the frangible intermediate section 128. A gold or gold-copper composite (not shown) may be deposited over the metal layer 154 in the manner as previously described in forming the leads 118.

From the foregoing discussion, the irregularity has taken the form of openings 134, 152 and dielectric projection 158. However, it is to be understood that the irregularity is any feature which would alter the crystal morphology of the lead forming material to provide the lead 118 with a weakened frangible intermediate section 128.

Figure 10:
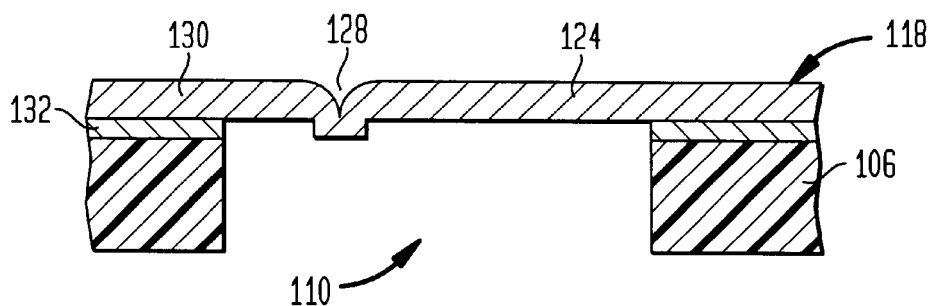
FIG. 10 is a cross-sectional view showing a lead having a frangible intermediate section constructed in accordance with the present invention.

Completion of formation of the leads 118 as shown in FIG. 10, and in particular, freeing the frangible intermediate section 128 from the dielectric layer 106, is accomplished by masking the bottom surface of the dielectric layer 106 with a mask (not shown). The mask has openings corresponding to the desired locations of the gaps 110 in the dielectric layer 106. Each such opening in the mask is aligned with the connection sections 124, 130 and frangible intermediate sections 128. The structure is then subjected to ablation by radiant energy directed through opening, thereby forming the gaps 110 in alignment with the connection sections 124, 130 of the leads 118 and in alignment with the frangible intermediate sections 128. The radiant energy applied to provide this ablation typically includes a KrF, $CO_2$, or Yag lasers operating under conditions which will substantially ablate the dielectric material 106, such as material, but which will not substantially affect the material of the leads 118 and the metal layers 132, 150. Subsequently, the exposed portion of the metal layers 132, 150 within the opening is also removed to free lead 118 using a selective etchant which will not etch the material forming the leads. As shown, the frangible intermediate section 128 lies within the gap 110 integrally connecting the connection sections 124, 130 of the leads 118.

Following complete separation of the leads 118, a compliant layer 108 may be applied on the bottom surface of the dielectric layer 106. Compliant layer 108 may be applied by lamination or by coating techniques such as stenciling or silk screening. Layer 108 is formed having gaps corresponding to the gaps 110 in the dielectric layer 106.

Figure 11:
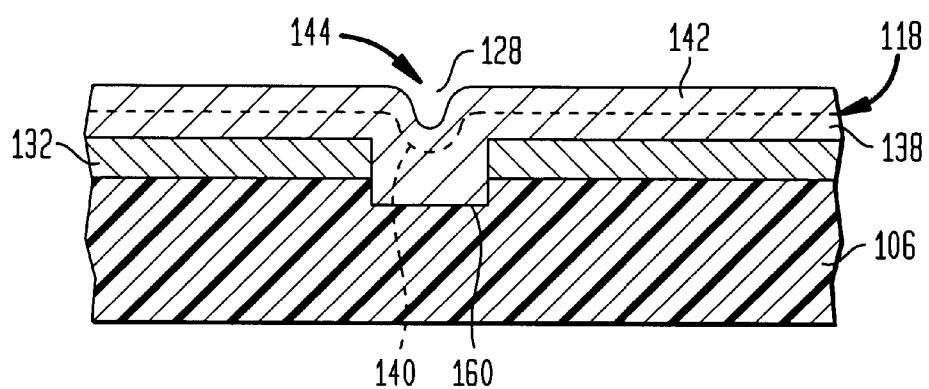
FIG. 11 is a cross-sectional view showing a method of making a lead having a frangible intermediate section in accordance with still another embodiment of the present invention.

Referring to FIG. 11, the dielectric layer 106 pursuant to another embodiment may be formed with a recess 160 in its outer facing surface. The recess 160 may be formed prior to depositing metal layer 132, or after depositing the metal layer using it as a mask. The recess 160 may be of any width or depth desired, as well as shape. It is contemplated that the recess 160 will enhance the disruption of the deposited metal layers 138, 142 in region 144 to create a greater weakening of the lead 118 thereat, i.e., at the frangible intermediate section 128.

Although only a few leads 118 and terminals 122 are illustrated in the drawings, it should be appreciated that a typical component 102 may include hundreds of leads and terminals. Also, although the few terminals 122 illustrated are side-by-side, in practice the terminals may be distributed over substantially the entire interior portion 112 of the dielectric layer 106, as well as alternatively on the peripheral portion 114. The portions of the leads 118 which will form the connection sections 124, 130 are disposed in rows. Within each row, all of the leads 118 extend in a lead direction, and adjacent leads 118 are spaced apart from one another in a widthwise direction. The widthwise dimension between each lead 118 desirably is between about 40 microns and about 115 microns depending on the actual width of the leads 118. Whereas, the center-to-center spacing between adjacent leads desirably is about 50 to about 150 microns. The width of each of the leads 118 is preferably about 15–20 microns. Each bus 120 desirably is about 80 to about 200 microns or more wide. The bus 120 and terminals 122 can be formed from the metal layers 138, 142, 154 prior to, during or subsequent to the formation of the leads 118 using the processes as thus far described. Each connection section is preferably about 30–40 microns long for connection section 124 and about 350–500 microns long for connection section 130. The frangible section 128 will generally be closer to one gap edge than the other to preserve space and maximize the downset lead length. The aforementioned feature sizes can be achieved readily using conventional photoresist deposition, exposure and development techniques and conventional plating techniques.

Figure 12:
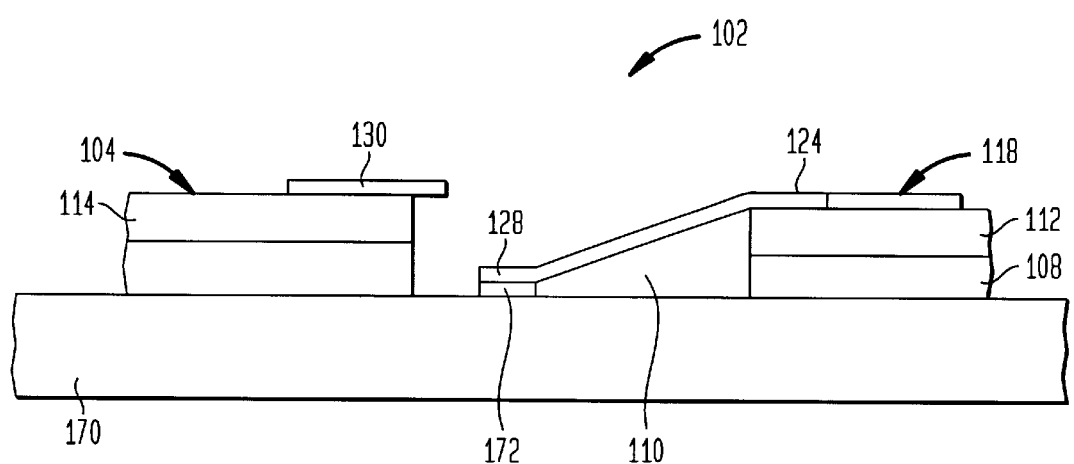
FIG. 12 is a cross-sectional view showing a lead constructed in accordance with the present invention bonded to a contact on a microelectronic component.

The completed connection component 102 can be used in the same manner as the connection components described in the '239 Patent and as shown in FIGS. 1 and 12. Thus, each component may be positioned on a semiconductor chip 170 so that rows of contacts 172 on the chip are aligned with gaps 110 and hence aligned with the various rows of leads 118. During the positioning procedure, the connection sections 124, 130 of each lead 118 are substantially maintained in position on the support structure 104, because both ends of each lead connection section are supported. Thus, each connection section 124, 130 is positioned with respect to the associated contact by positioning of the connection component 102 with respect to the chip. Each lead 118 is then engaged by a bonding tool and more precisely aligned with the contact on the chip by the bonding tool. As the bonding tool moves each lead 118 downwardly toward the contact 172, the frangible intermediate section 128 of the lead 118 breaks at the weakened region, allowing the lead to move freely into engagement with the contact, and the connection section 130 is permanently bonded to the chip contact.

The leads 118 of the invention can also be employed in leads which include a polymer layer. Preferably, the polymer layer is absent in the bonding region, or in the part of the bonding region engaged by the bonding tool, to permit efficient energy coupling between the tool and the bond interface. The polymer layer may be provided on either side of the lead 118. Combined metal and polymer lead structures are shown in U.S. Pat. No. 5,489,749, and in U.S. patent application Ser. No. 08/715,571 filed on Sep. 18, 1996, the disclosures of which are incorporated by reference herein.

As thus far described, the leads 118 may extend on either side of a dielectric layer included in a support structure. Thus, the leads 118 depicted in the drawing extend on the top surface of the dielectric layer, remote from the semiconductor chip or other microelectronic element having the contact to which the leads are bonded. However, the leads 118 may extend across the dielectric layer on the bottom surface. Also, the support structure need not include a dielectric layer, but instead may include a metallic lead frame which is used to hold the leads temporarily and which is removed from the leads during or after bonding.

Although the invention herein has been described with reference to particular embodiments, it is to be understood that the embodiments are merely illustrative of the principles and application of the present invention. It is therefore to be understood that numerous modifications may be made to the embodiments and that other arrangements may be devised without departing from the spirit and scope of the present invention as defined by the claims.

What is claimed:

1. A method of making a lead having a frangible intermediate section for use in a microelectronic component, said method comprising the steps of depositing a metal layer over a support; providing an irregularity on said metal layer; depositing lead forming material over said metal layer and said irregularity; and removing said irregularity whereby said lead includes a frangible intermediate section at the location of said irregularity.

2. The method of claim 1, wherein said irregularity comprises an opening within said metal layer.

3. The method of claim 2, wherein said opening has a width less than about 30 microns.

4. The method of claim 1, wherein said metal layer has a thickness in the range of about 0.01 to about 10 microns.

5. The method of claim 1, wherein said irregularity comprises a projection of dielectric material extending upwardly from the surface of said metal layer.

6. The method of claim 5, wherein said projection has a height of less than about 10 microns.

7. The method of claim 5, wherein said projection has a width in the range of about 5 to about 15 microns.

8. The method of claim 1, further including the step of forming a recess in said support underlying said irregularity.

9. The method of claim 1, further including depositing another metal layer over said lead forming material.

10. A method of making a microelectronic component comprising the steps of forming at least one lead from lead forming material extending over a gap extending through a vertical extent of a support structure, each said lead having a first connection section extending from the support structure on one side of the gap, a second connection section extending from the support structure on the other side of the gap, and a frangible intermediate section joining said connection sections, said frangible intermediate section formed by depositing said lead forming material over an irregularity at the location of said frangible intermediate section, said frangible intermediate section and at least a part of said first connection section aligned over said gap so that said first connection section of each lead can be detached from said second connection section by breaking the frangible intermediate section upon being displaced in said gap.

11. The method of claim 10, further including the step of providing said irregularity overlying said support structure, and depositing said lead-forming material over said irregularity.

12. The method of claim 11, wherein said providing said irregularity comprises forming a metal layer on said support structure having an opening therein.

13. The method of claim 12, wherein said opening has a width less than about 30 microns.

14. The method of claim 12, wherein said metal layer has a thickness in the range of about 0.01 to about 10 microns.

15. The method of claim 12, further including the step of forming a recess in the surface of said support structure in alignment with said opening.

16. The method of claim 10, wherein said providing said irregularity comprises forming a projection of dielectric material extending upwardly from said support structure.

17. The method of claim 16, wherein said projection has a height of less than about 10 microns.

18. The method of claim 16, wherein said projection has a width in the range of about 5 to about 15 microns.

19. The method of claim 16, further including the step of providing a metal layer over the surface of said support structure and providing said projection extending upwardly from said metal layer.

20. The method of claim 10, further including forming a plurality of leads extending over said gap.

21. A method of making electrical connection to a microelectronic component having at least one contact, said method comprising juxtaposing a connection component with a microelectronic component, said connection component having a supporting structure and at least one lead made in accordance with the method of claim 1 connected to said supporting structure, said lead including a bond region adjacent said frangible intermediate section adapted to be aligned with said contact, severing said lead at said frangible intermediate section, and bonding said bond region of said lead to said contact on said microelectronic component.

22. the method of claim 21, further including providing a plurality of said leads each having a bond region adjacent a frangible intermediate section and bonding said bond region of each of said leads to a corresponding contact on said microelectronic component.

23. the method of claim 21, wherein said irregularity comprises an opening within said metal layer.

24. The method of claim 21, wherein said irregularity comprises a projection of dielectric material extending upwardly from the surface of said metal layer.

25. The method of claim 21, further including the step of forming a recess in said support underlying said irregularity.

26. The method of claim 21, further including depositing another metal layer over said lead forming material.

27. A method of making a microelectronic assembly comprising electrically connecting a microelectronic component to another microelectronic component, at least one of said microelectronic components made in accordance with the method of claim 10.

28. The method of claim 27, wherein said irregularity comprises an opening within said metal layer.

29. The method of claim 27, wherein said irregularity comprises a projection of dielectric material extending upwardly from the surface of said metal layer.

30. The method of claim 27, further including the step of forming a recess in said support underlying said irregularity.

31. The method of claim 27, further including depositing another metal layer over said lead forming material.

* * * * *